(12) United States Patent
Sundaresh et al.

(10) Patent No.: US 9,836,802 B2
(45) Date of Patent: Dec. 5, 2017

(54) SYSTEM TO MAKE CONSUMERS AWARE OF ELECTRICITY USAGE

(75) Inventors: Nagaraja Sundaresh, Sanjaynagar Bangalore (IN); Pradeep Shetty, Bangalore (IN); Rajesh Ramesh, Karnataka (IN); Chandrashekar Padubidri, Karnataka (IN); Rangesa Arakere, Karnataka (IN); Ananda Huchappa Shastry, Bangalore (IN)

(73) Assignee: Honeywell International Inc., Morris Plains, NJ (US)

( * ) Notice: Subject to any disclaimer, the term of this patent is extended or adjusted under 35 U.S.C. 154(b) by 1550 days.

(21) Appl. No.: 12/485,167

(22) Filed: Jun. 16, 2009

(65) Prior Publication Data

US 2009/0312969 A1    Dec. 17, 2009

(51) Int. Cl.
| | |
|---|---|
| *G06F 19/00* | (2011.01) |
| *G06Q 99/00* | (2006.01) |
| *G01R 21/00* | (2006.01) |
| *G06Q 50/00* | (2012.01) |
| *G06Q 50/06* | (2012.01) |
| *G01R 22/10* | (2006.01) |

(52) U.S. Cl.
CPC ............ *G06Q 50/06* (2013.01); *G01R 22/10* (2013.01)

(58) Field of Classification Search
CPC ..................................................... G06Q 50/06
USPC ................... 702/61, 62, 183; 340/870.02
See application file for complete search history.

(56) References Cited

U.S. PATENT DOCUMENTS

| | | | |
|---|---|---|---|
| 4,046,532 A | | 9/1977 | Nelson |
| 4,341,345 A | | 7/1982 | Hammer et al. |
| 4,345,162 A | | 8/1982 | Hammer et al. |
| 4,389,577 A | | 6/1983 | Anderson et al. |
| 4,577,977 A | | 3/1986 | Pejsa |
| 4,644,320 A | * | 2/1987 | Carr et al. ................. 340/12.37 |
| 4,924,404 A | * | 5/1990 | Reinke, Jr. .................... 705/412 |
| 5,598,349 A | | 1/1997 | Elliason et al. |
| 6,552,525 B2 | * | 4/2003 | Bessler ..................... 324/103 R |
| 6,574,581 B1 | | 6/2003 | Bohrer et al. |
| 6,838,978 B2 | * | 1/2005 | Aizu et al. ............... 340/286.02 |
| 6,931,445 B2 | * | 8/2005 | Davis ............................ 709/224 |
| 6,975,958 B2 | | 12/2005 | Bohrer et al. |
| 7,058,524 B2 | * | 6/2006 | Hayes et al. .................... 702/62 |
| 7,346,467 B2 | | 3/2008 | Bohrer et al. |
| 7,379,997 B2 | * | 5/2008 | Ehlers et al. ................. 709/224 |
| 7,392,115 B2 | | 6/2008 | Schindler |
| 2005/0060107 A1 | * | 3/2005 | Rodenberg et al. ............ 702/62 |
| 2007/0271006 A1 | * | 11/2007 | Golden et al. ................ 700/295 |
| 2008/0011864 A1 | | 1/2008 | Tessier et al. |
| 2008/0027885 A1 | * | 1/2008 | van Putten et al. .......... 705/412 |

(Continued)

OTHER PUBLICATIONS

Ecobee, Smart Thermostat Installation Manual, pp. 1-26, 2009.
Ecobee, Smart Thermostat User Manual, pp. 1-32, 2009.

(Continued)

*Primary Examiner* — John Breene
*Assistant Examiner* — Yaritza H Perez Bermudez
(74) *Attorney, Agent, or Firm* — Seager, Tufte & Wickhem, LLP

(57) ABSTRACT

Energy usage of a plurality of appliances is measured using a single meter. A pattern of energy usage with respect to the plurality of appliances is determined dependent upon the measured energy usage, appliance details of the plurality of appliances, and usage hours of the plurality of appliances. The pattern is provided to a user of the appliances.

9 Claims, 9 Drawing Sheets

(56) References Cited

U.S. PATENT DOCUMENTS

| | | |
|---|---|---|
| 2008/0228325 A1 | 9/2008 | Schindler |
| 2008/0238406 A1* | 10/2008 | Banhegyesi ................. 324/120 |
| 2009/0001180 A1 | 1/2009 | Siddaramanna et al. |
| 2009/0001181 A1 | 1/2009 | Siddaramanna et al. |
| 2009/0001182 A1 | 1/2009 | Siddaramanna et al. |
| 2009/0045804 A1* | 2/2009 | Durling et al. ........... 324/140 R |
| 2009/0195349 A1* | 8/2009 | Frader-Thompson et al. ............................. 340/3.1 |

OTHER PUBLICATIONS

Ecobee, Screenshot of Ecobee Web Site Window, Captured prior to Jun. 16, 2009.

Ecobee, "Meet the Ecobee Smart Thermostat," Sales Sheet, 2 pages, prior to Jun. 16, 2009.

http://www.ecobee.com/productspecifications, "Programmable Thermostats and Other Green Living Products—Specifications," 2 pages, 2009.

\* cited by examiner

| Appliance | Number of Appliances | Wattage Rating | Hours of Usage |
|---|---|---|---|
| Hot Water | 3 | 1500 | 7 AM to 10 AM |
| Television | 3 | 80 | 1 PM to 2 PM<br>7 PM to 9 Pm |
| Lights | 5 | 40 | 6 PM to 10 PM |
| Refrigerator | 1 | NA | All Day |
| Washing Machine | 1 | NA | 12 PM to 1 PM |
| Fans | 5 | 70 | 7 PM to 7 AM |
| Microwave | 1 | 1100 | 12 PM to 1 PM<br>5 PM to 6 PM |

Figure 3

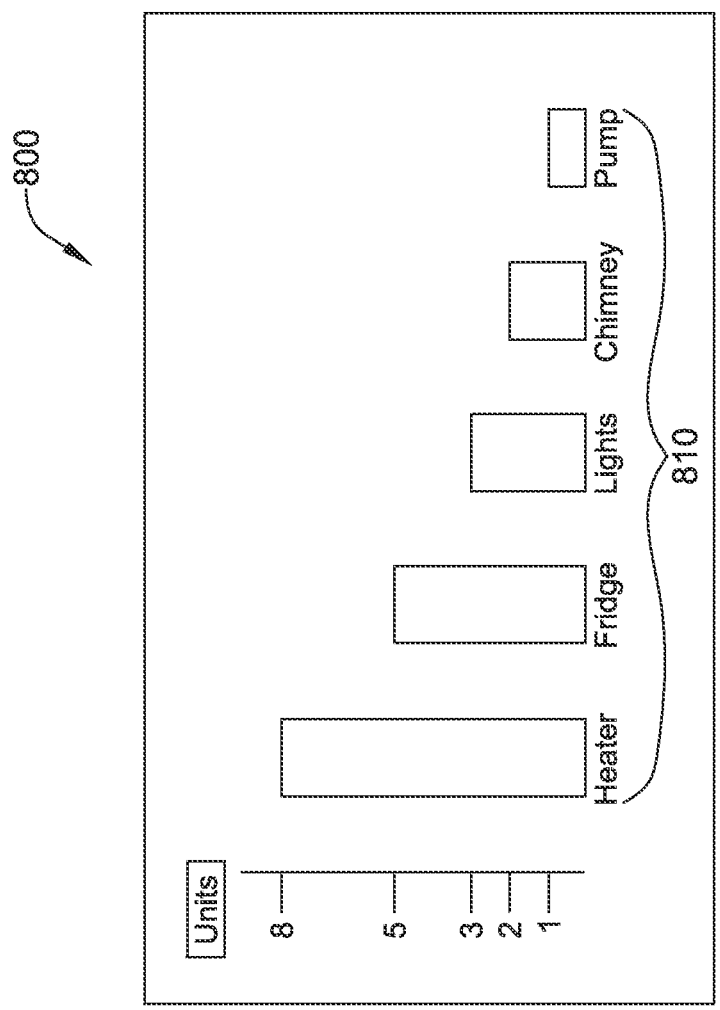

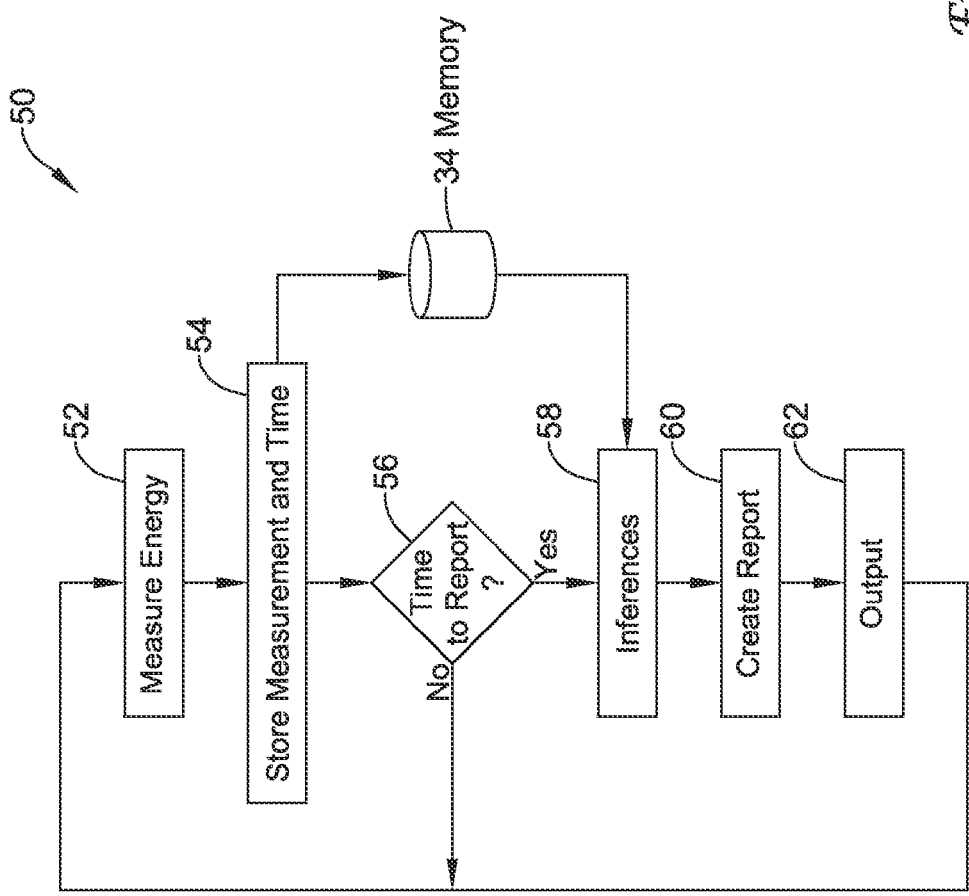

SYSTEM TO MAKE CONSUMERS AWARE OF ELECTRICITY USAGE

TECHNICAL FIELD

The technical field of the present application relates to making end consumers aware of their electricity usage.

BACKGROUND

In order to make energy consumers such as home owners aware of the energy usage of their various appliances, information regarding energy usage is often provided to the energy consumers. It is hoped that this awareness will help energy consumers to avoid energy waste in operating their appliances.

Measurement equipment could, of course, be installed for each of the consumer's energy consuming appliances, or least for each of the consumer's major energy consuming appliances. Outputs from such equipment could then be used to inform the consumers of the energy usage of their appliances. However, such equipment adds extra cost for each of the appliances being monitored.

Moreover, it is also desirable to install communication equipment in order to communicate the energy consumption of the various appliances to a central module where the energy awareness information related to the appliances can be calculated and presented to the consumer. However, if energy measuring equipment is used for each appliance, providing communication equipment for each energy measuring equipment results in even more cost.

Disclosed herein is an energy awareness system which avoids the addition of energy measurement equipment at each of the appliances to be monitored for energy awareness. Instead, the energy awareness system adds only one energy measurement equipment at the mains of the building or house. The awareness system, for example, may be arranged to poll the energy measurement equipment at the mains in order to fetch the energy consumption at the mains, and may further be arranged to use this energy consumption data and profiles of each of the appliance within the building or house to infer the consumption for each appliance.

BRIEF DESCRIPTION OF THE DRAWINGS

Features, aspects, and advantages of the present invention will become better understood when the following detailed description is read with reference to the accompanying drawings in which:

FIG. 3 illustrates an example of table containing appliance details and usage hours stored in memory of the energy awareness system of FIG. 1;

FIG. 8 illustrates an example of an energy consumption report that may be provided to occupant(s) of a building in which the energy awareness system of FIG. 1 is deployed; and, FIG. 9 is a flow chart of an example program that can be executed to create the report of FIG. 8.

DETAILED DESCRIPTION

Figure 1:
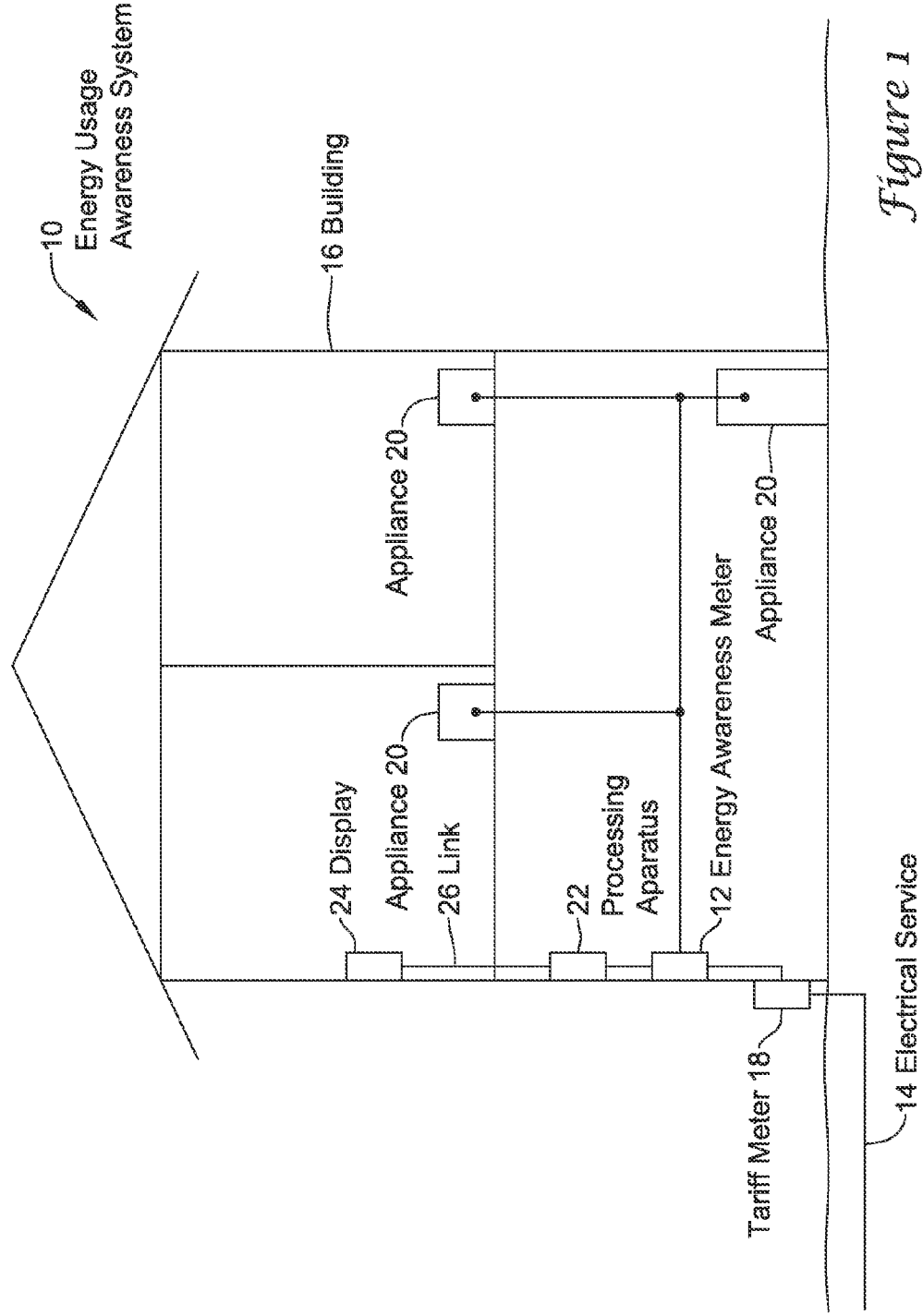
FIG. 1 illustrates an example of an energy awareness system.

As shown in FIG. 1, an energy usage awareness system 10 includes an energy awareness meter 12 that is coupled in an electrical service 14 of a facility or building 16 downstream of an electric company's tariff meter 18. The energy awareness meter 12, for example, may be a digital meter, and the building 16, for example, may be a residence such as a house. However, the energy awareness meter 12 may be other than a digital meter, and the building 16 may be other than a residence. The electric company's tariff meter 18 supplies energy usage information that is used for billing purposes by the electric company providing the electrical service 14 to the building 16.

The energy awareness meter 12 measures the energy used by a plurality of appliances 20 within the building 16 on a periodic basis, such as once a minute, to provide the measured energy usage information with a fine level of granularity. Thus, the granularity of the energy consumption measurements is at the minute by minute level. However, the energy awareness meter 12 may measure the energy consumed by the appliances 20 within the building 16 on a periodic basis other than once a minute, or the energy awareness meter 12 may measure the energy consumed by the appliances 20 within the building 16 on a non-periodic basis.

The energy usage awareness system 10 also includes a processing apparatus 22. The energy awareness meter 12 communicates the measured energy usage information to the processing apparatus 22 as soon as the energy awareness meter 12 acquires the measured energy usage information. Alternatively, the energy awareness meter 12 may be arranged to store the measured energy usage information over a predetermined amount of time, such as hourly, and then communicate the stored information hourly to the processing apparatus 22. The processing apparatus 22 maintains the granularity of the energy usage measured by the energy awareness meter 12.

The processing apparatus 22 may be provided locally within the building 16. For example, the processing apparatus 22 may be located at the energy awareness meter 12. In this case, the processing apparatus 22 and the energy awareness meter 12 may be contained within the same housing or separate housings.

Alternatively, the processing apparatus 22 may be located within the building 16 but remotely from the energy awareness meter 12. In this case, the processing apparatus 22 may be located so as to provide convenient access to the occupant(s) of the building 16.

As a further alternative, the processing apparatus 22 may be provided remotely from the building 16. In this case, at least a display 24 of the processing apparatus 22 is located within the building 16 to provide energy awareness information to its occupant(s). However, instead of providing the energy awareness information to the occupant(s) of the building 16 by use of the display 24 associated with the processing apparatus 22, the energy awareness information can be otherwise provided to the occupant(s) of the building 16 such as by use of e-mail or postal mail.

The energy awareness meter 12 may be coupled to the processing apparatus 22 by a link 26. For example, the link 26 may be a wire link. A wire link may be most convenient in the case where the energy awareness meter 12 and the processing apparatus 22 are located proximate to one another. Alternatively, the link 26 may be a wireless link. A wireless link may be most convenient in the case where the processing apparatus 22 is located remotely from the building 16 at which the energy awareness meter 12 is used. In the case where the energy awareness meter 12 and the processing apparatus 22 are located remotely from one another but both within the building 16, the link 26 may be either a wire link or a wireless link to couple the energy awareness meter 12 and the processing apparatus 22.

Figure 2:
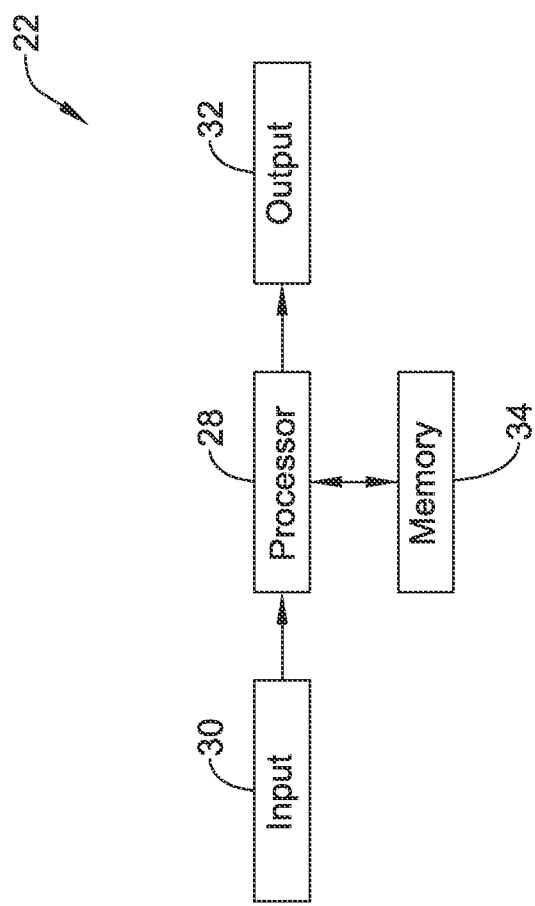
FIG. 2 illustrates processing equipment that can be used in the energy awareness system of FIG. 1.

As shown in FIG. 2, the processing apparatus 22, for example, includes a processor 28 such as computer, an input 30, an output 32, and a memory 34.

The input 30 may include one or more input devices such as a mouse, a keyboard, etc. capable of inputting data to the processor 28. The input 30 may be used to input data. This data may be stored in the memory 34 or may be used directly by the processor 28.

The output 32 may include one or more output devices such as a monitor, a printer, etc. The monitor of the output 32 may or may not comprise the display 24.

The memory 34 stores data such as input data, energy measurement data, and/or output data. The memory 34 may also store programming for operating the processor 28 and for providing the energy awareness information as described herein.

The occupant(s) of the building 16 provides appliance details and hours of usage regarding the use of each electrical appliance on typical days such as workdays, holidays, and weekends. This input is provided by use of the input 30 and is stored in the memory 34 or elsewhere. The processor 28 may lead the occupant(s) through the input of this data by way of suitable displays on the output 32.

The appliance details includes, for example, the rating and type of each of the electrical appliances. These electrical appliances are, for example, dishwashers, clothes washers, clothes dryers, air conditioners, electric heaters, hot water heaters, etc.

FIG. 3 is a table 300 showing an example of appliance details 310 and usage hours 320 stored in the memory 34. Based on this table 300, certain inferences about the power consumed by the appliances in a building can be made from the actual overall power consumption as measured by the energy awareness meter 12.

Figure 4:
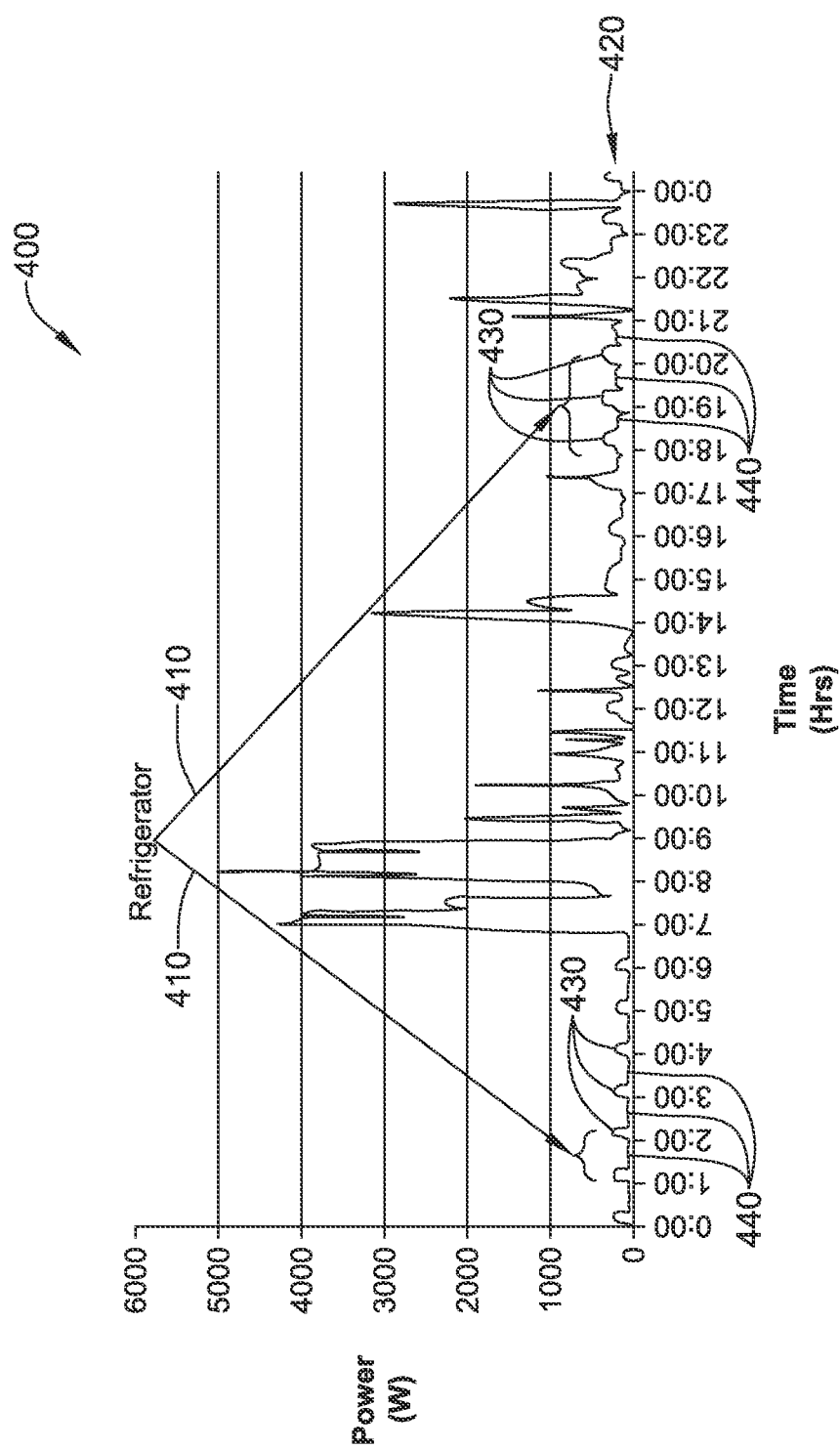
FIGS. 4-7 are graphs showing example inferences that can be made based on power consumption measured by a single energy awareness meter.

The graph 400 of FIG. 4 shows by way of example the overall energy consumption by the appliances of a building as measured by the energy awareness meter 12. The graph of FIG. 4 specifically points outs the inference 410 that can be made as to the power consumed by a refrigerator. This inference 410 is based on the table 300 of FIG. 3 and the building energy consumption 420 as measured by the energy awareness meter 12. Although a refrigerator is turned "on" all of the time, its compressor actually cycles "on" 430 and "off" 440 at a rate that depends on a number of factors. These factors include how well the refrigerator is insulated, room temperature, freezer temperature, how often the door is opened, cleanliness of the evaporator coils, defrosting regularity, and the condition of door seals. It is assumed for purposes of FIG. 4 that the refrigerator cycles approximately 15 minutes on and 45 minutes off. Also, the refrigerator continues to draw a small amount of power even when it is switched "off." The graph 400 of FIG. 4 shows that the "on" 430 and "off" 440 cycles exist throughout the day.

Figure 5:
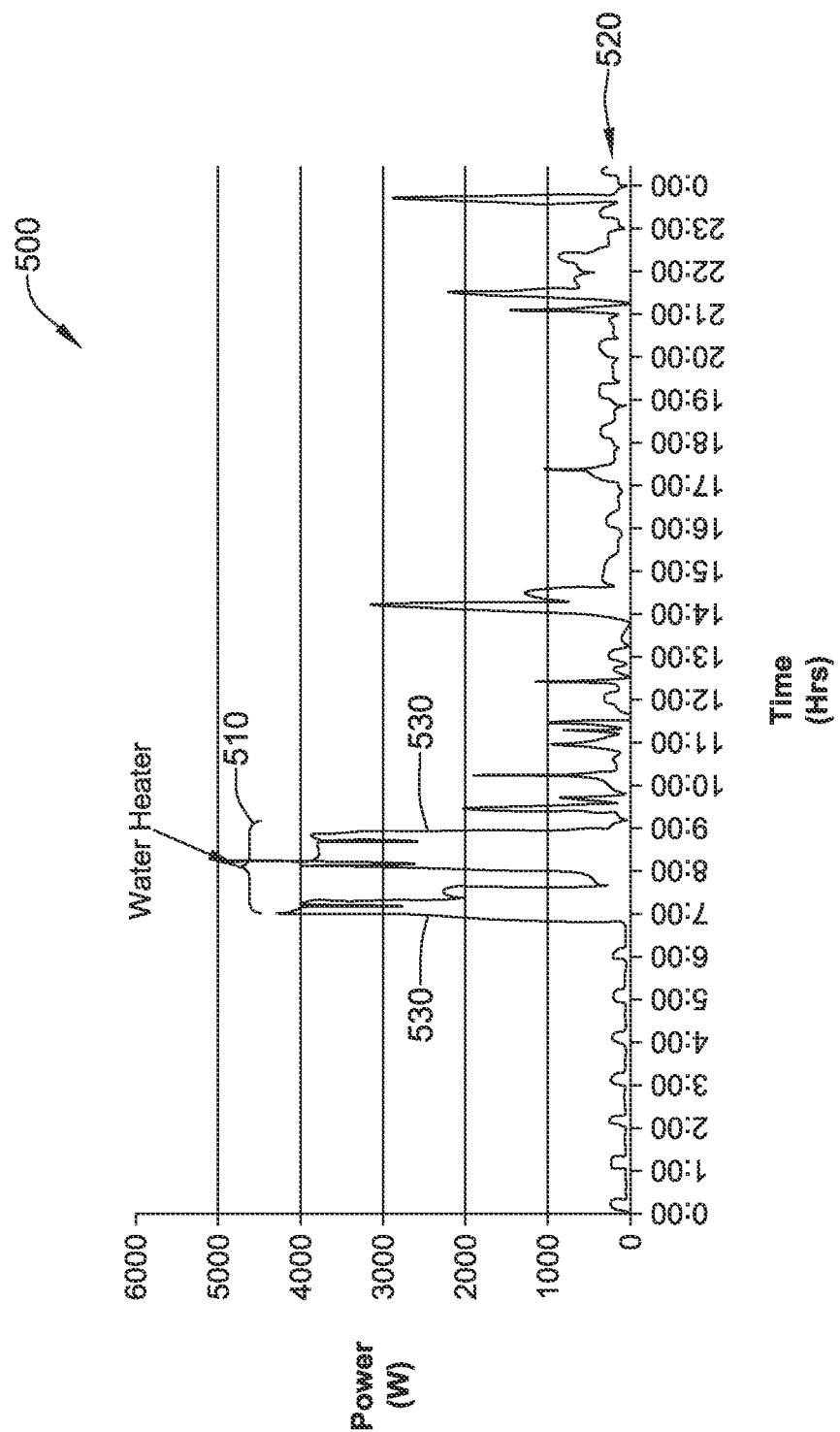

The graph 500 of FIG. 5 specifically points outs the inference 510 that can be made as to the power consumed by water heaters. Again, this inference 510 is based on the table 300 of FIG. 3 and the building energy consumption 520 as measured by the energy awareness meter 12. The graph 500 of FIG. 5 specifically points out the inferred contribution 510 of two hot water heaters to the overall energy consumption 520 measured by the energy awareness meter 12. The hot water heaters in this example each has a rating of 1500 watts and above. This graph 500 shows that the two hot water heaters are "on" 530 primarily between 7:00 AM and 9:00 AM.

Figure 6:
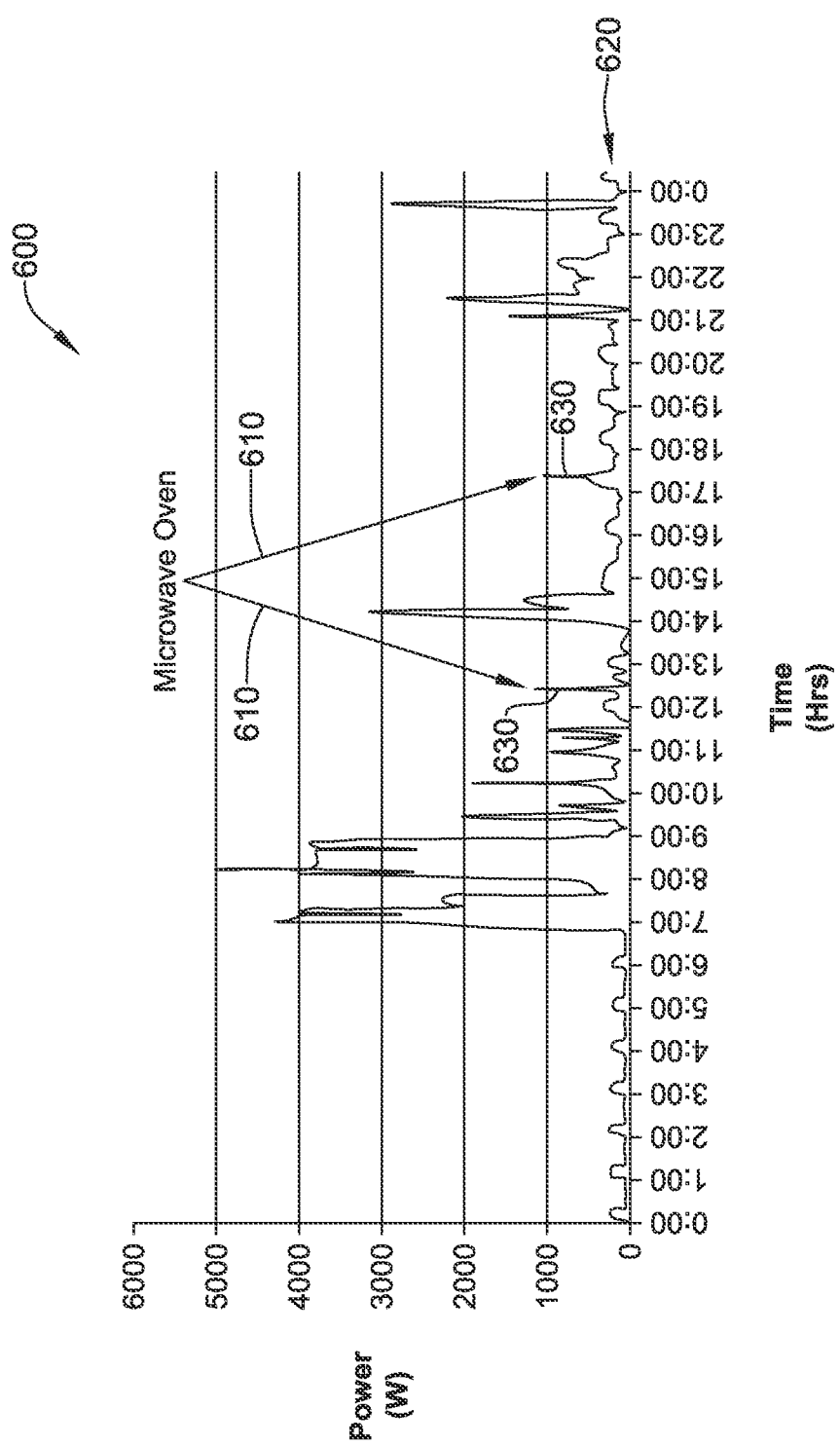

The graph 600 of FIG. 6 specifically points outs the inference 610 that can be made as to the power consumed by a microwave oven. This inference 610 is likewise based on the table 300 of FIG. 3 and the building energy consumption 620 as measured by the energy awareness meter 12. The microwave oven in this example has a rating of 1100 watts. The microwave is on for a short duration, typically 1 to 3 minutes. The graph 600 of FIG. 6 shows the two short duration spikes 630 corresponding to microwave oven usage.

Figure 7:
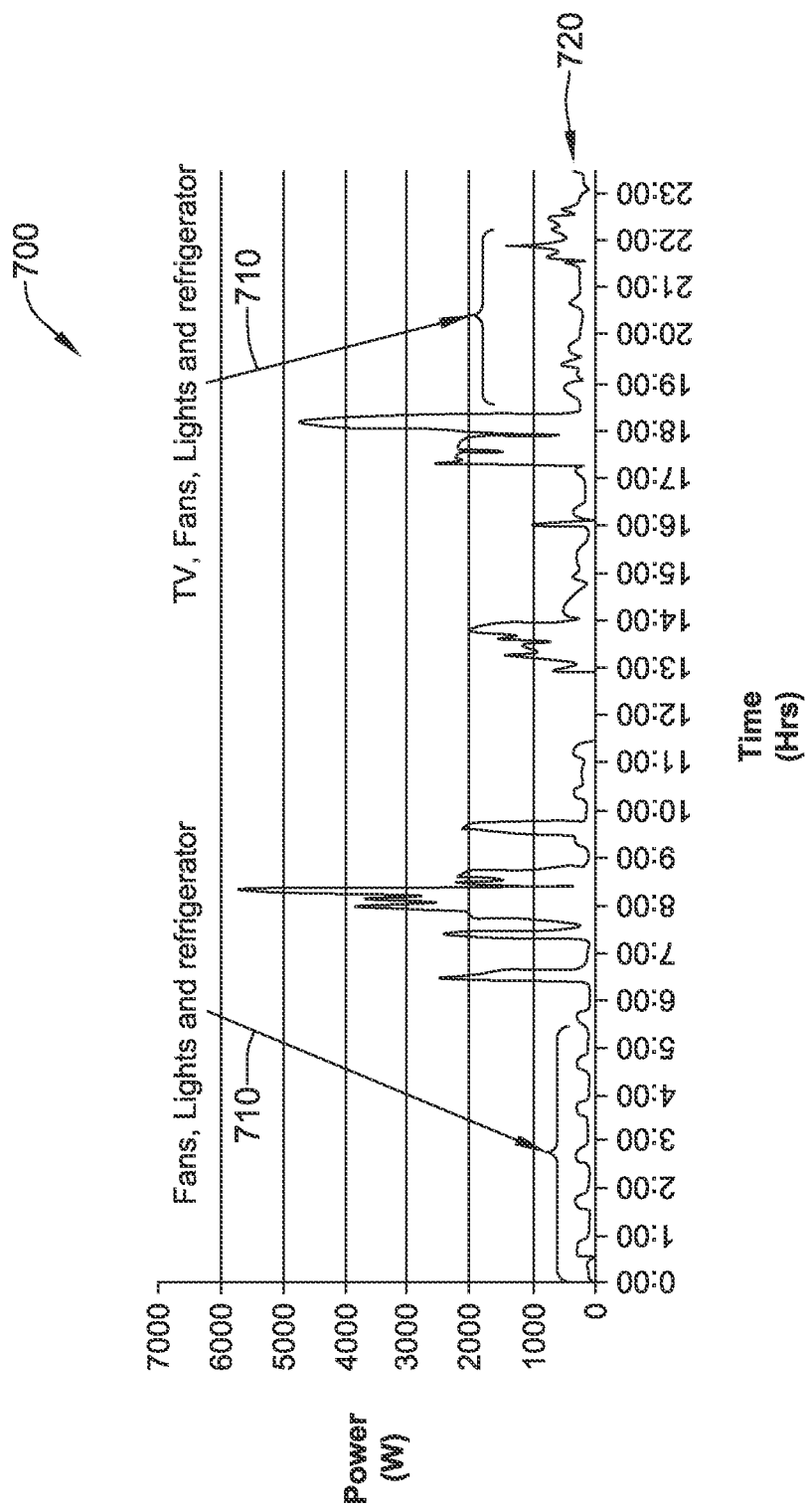

The graph 700 of FIG. 7 specifically points outs the inference 710 that can be made as to the power consumed by fans, lights, and the refrigerator. This inference 710 is based on the table 300 of FIG. 3 and the building energy consumption 720 as measured by the energy awareness meter 12.

Each time the energy awareness meter 12 measures energy usage within the building 16, the processing apparatus 22 refers to the appliance details and usage hours stored in the memory 34 in order to infer which appliance is being used.

The processing apparatus 22 assembles this inferred energy usage information 810 into a report 800 such as shown in FIG. 8 to make the occupant(s) aware of the energy consumption of the various appliances within the building 16. This report 800, for example, shows the energy usage pattern for the appliances of the building 16. As indicated above, this report may be displayed on the display 24, may be e-mailed to the occupant(s), or may be postal mailed to the occupant(s).

Accordingly, energy consumption awareness information may be provided for some or all of the appliances of a building by use of a single energy awareness meter.

FIG. 9 if a flow chart illustrating a program 50 that may be stored in the memory 34 and executed by the processor to produce the power consumption reports by appliance even though only a single measurement device is used as discussed above.

At 52 of the program 50, the power consumption of the facility or building 16 as measured by the energy awareness meter 12 is read. At 54, the power consumption read at 52 and the time of the reading is stored in the memory 34. As indicated above, the granularity of the readings may be on a minute by minute basis. In this case, the output of the energy awareness meter 12 is read at 52 and is stored at 54 each minute. However, any other suitable level of granularity can be used.

At 56, a determination is made as to whether it is time to report appliance by appliance power consumption. Such a report may be made daily or on any other desired basis. If it is not time to report, program flow returns to 52 for additional measurements. If it is time to report, appliance by appliance inferences are made at 58 based on the table of FIG. 3 that is stored in the memory 34 and the measurements that are read at 52 and are stored in the memory 34 at 54. At 60, an appliance by appliance power consumption report such as shown in FIG. 8 is created based on these inferences. At 62, this report is provided as an output. For example, the report may be provided on the output 32 such as by way of a displayed and/or printed report.

Certain modifications of the present invention have been discussed above. Other modifications of the present invention will occur to those practicing in the art of the present invention.

For example, the energy usage awareness system 10 has been described above in connection with making building occupant(s) of their electrical energy usage patterns. However, the energy usage awareness system 10 can be used to make building occupant(s) of their patterns of using other forms of energy such as gas. If the energy usage awareness system 10 is used to make building occupant(s) of their gas usage patterns, the energy awareness meter 12 would be arranged to measure gas flow at the main input to the building 16, and the memory 34 stores appliance details includes, for example, the rating and type of each of the gas appliances. These gas appliances are, for example, dishwashers, clothes washers, clothes dryers, hot water heaters, and/or other gas consuming appliances.

As another example, the building 16 may be a residence, a factory, an office building, a warehouse, or any other structure or enclosure or otherwise within which plural appliances are used.

Consequently, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. An energy usage awareness method comprising:
    measuring combined energy usage of a plurality of appliances within a building using a single meter;
    retrieving appliance information from a memory, the appliance information comprising information about the types of appliances installed within the building, the number of appliances of each type installed within the building, ratings information of each of the appliances, and a listing of typical usage hours of each appliance;
    inferring a pattern of energy usage for each appliance using the measured energy usage, the appliance information, and the listing of typical usage hours of each appliance type; and,
    providing the pattern of energy usage to a user of the appliances.

2. The method of claim 1 wherein the step of providing the pattern to a user of the appliances comprises displaying the pattern on a display.

3. The method of claim 1 wherein the step of providing the pattern to a user of the appliances comprises displaying the pattern on a display that is located so as to be viewable by the user and that is located remotely from the single meter.

4. The method of claim 1 wherein the step of measuring energy usage comprises measuring the energy usage at a point that is between a tariff meter and the appliances.

5. The method of claim 4 wherein the step of providing the pattern to a user of the appliances comprises displaying the pattern on a display.

6. The method of claim 4 wherein the step of providing the pattern to a user of the appliances comprises displaying the pattern on a display that is located so as to be viewable by the user and that is located remotely from the single meter.

7. The method of claim 1 wherein the step of measuring energy usage of a plurality of appliances using a single meter comprises communicating the measured energy usage to a processor, and wherein the determining of a pattern of energy usage comprises determining the pattern of energy usage by use of the processor.

8. The method of claim 7 wherein the step of communicating the measured energy usage to a processor comprises communicating the measured energy usage to the processor over a wire link.

9. The method of claim 7 wherein the step of communicating the measured energy usage to a processor comprises communicating the measured energy usage to the processor over a wireless link.

* * * * *